United States Patent [19]

Ebe et al.

[11] Patent Number: 5,728,425
[45] Date of Patent: Mar. 17, 1998

[54] METHOD FOR CHEMICAL VAPOR DEPOSITION OF SEMICONDUCTOR FILMS BY SEPARATE FEEDING OF SOURCE GASES AND GROWING OF FILMS

[75] Inventors: Hiroji Ebe; Akira Sawada; Hiroshi Takigawa, all of Kawasaki, Japan

[73] Assignee: Fujitsu Limited, Kawasaki, Japan

[21] Appl. No.: 28,143

[22] Filed: Mar. 9, 1993

[30] Foreign Application Priority Data

Mar. 18, 1992 [JP] Japan ................... 4-061956

[51] Int. Cl.$^6$ ................................................. C23C 16/44
[52] U.S. Cl. ................. 427/248.1; 427/255; 427/255.2
[58] Field of Search ................. 427/126.1, 255, 427/255.1, 255.2, 252, 248.1; 118/715, 722

[56] References Cited

U.S. PATENT DOCUMENTS

| | | | |
|---|---|---|---|
| 4,436,580 | 3/1984 | Boyd et al. | 427/309 |
| 4,886,683 | 12/1989 | Hoke et al. | 427/252 |
| 4,904,337 | 2/1990 | Elliott et al. | 156/610 |
| 4,933,207 | 6/1990 | Jensen et al. | 427/252 |
| 4,946,543 | 8/1990 | Kalisher et al. | 156/610 |
| 5,015,330 | 5/1991 | Okumura et al. | 156/643 |
| 5,017,404 | 5/1991 | Paquet et al. | 427/45.1 |
| 5,151,305 | 9/1992 | Matsumoto et al. | 427/252 |
| 5,194,406 | 3/1993 | Bok et al. | 437/225 |
| 5,230,925 | 7/1993 | Ohmine | 427/255.3 |

*Primary Examiner*—Shrive Beck
*Assistant Examiner*—Timothy Meeks
*Attorney, Agent, or Firm*—Armstrong,Westerman, Hattori,McLeland & Naughton

[57] ABSTRACT

A method and apparatus in which separate steps are used between feeding source gases and growing films in a process of chemical vapor deposition (CVD) for compound semiconductor films. In one embodiment, a CVD reactor chamber has a piston which can change the volume of the chamber to control the pressure of the source gases therein. After source gases are fed to the chamber having a substrate under the condition that no CVD takes place due to an insufficient vapor pressure, the chamber is kept closed for a few seconds, and then pressurized by the piston to start CVD. A typical result indicates that a $Hg_{1-x}Cd_xTe$ (where x=0.2) film on a 3-inch CdTe wafer has only 1% (or $\Delta x=0.002$) inhomogeneity in composition.

8 Claims, 2 Drawing Sheets

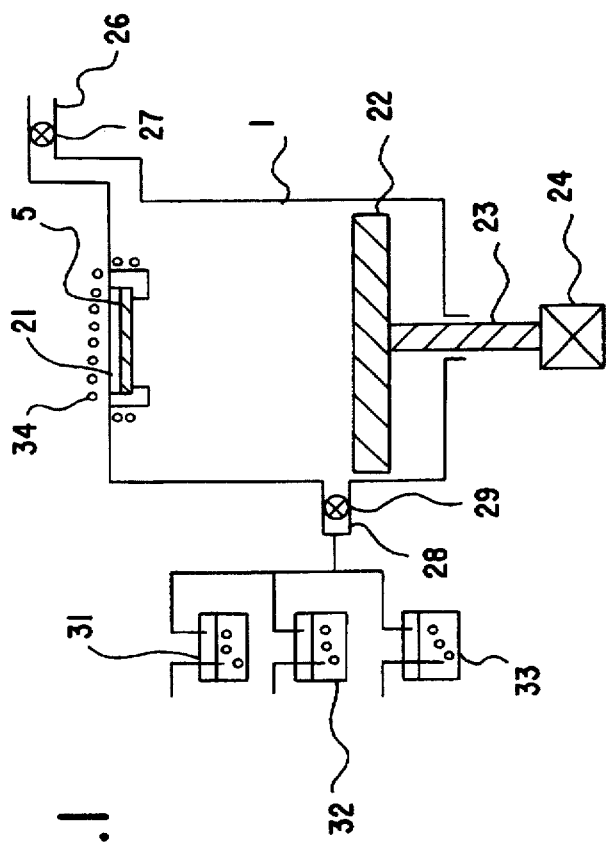
FIG.1
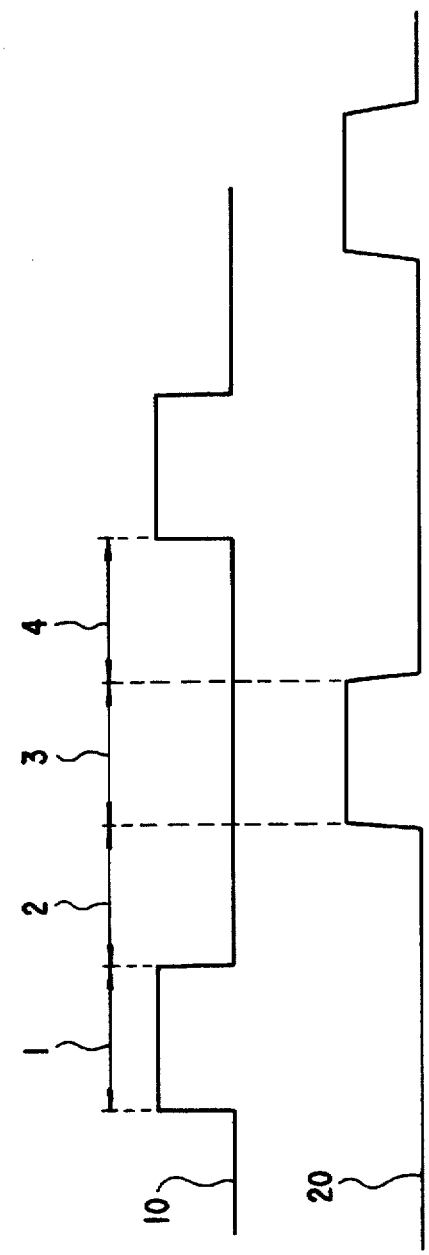
FIG.2(a)
FIG.2(b)

METHOD FOR CHEMICAL VAPOR DEPOSITION OF SEMICONDUCTOR FILMS BY SEPARATE FEEDING OF SOURCE GASES AND GROWING OF FILMS

BACKGROUND OF THE INVENTION

1. Field of the Invention

The present invention relates to a method and apparatus for chemical vapor deposition (hereinafter, simply called as CVD) of semiconductor films, and more practically, relates to an improved method and CVD apparatus which is suitable for use with compound semiconductor films.

2. Description of the Prior Art

In manufacturing infrared detectors made of compound semiconductor materials such as mercury-cadmium-tellurium (hereinafter, simply called as $Hg_{1-x}Cd_xTe$, wherein subscripts indicate molecular weights), a metal organic chemical vapor deposition (hereinafter, simply called as MOCVD) method is commonly used whereby a compound semiconductor film is grown on a heated substrate by thermal decomposition of source gases, such as mercury, di-isopropyltellurium, and di-methylcadmium. A substantial drawback of this method is instability in the composition of an epitaxial film. This draw back is due to the fact that, since the sudden introduction of source gases into a wide chamber from a narrow inlet tube gives rise to localizing gas flows, the density of the source gases becomes, non-homogeneous on the surface of the substrate.

Another method widely used is molecular beam epitaxy (hereinafter, simply called as MBE), wherein Knudsen cells containing source metals are placed with a substrate in a reactor chamber evacuated to a very low pressure, and a film is deposited by evaporating metals in a form of molecular beams from each crucible with a precisely controlled temperature. In MBE, the radial dependence of film thickness is unavoidable because the distance between a point source and each irradiated unit area on the surface of the substrate varies with the radiant direction.

To overcome the above mentioned problem with MOCVD, some technical attempts have been done, for instance, in a Japanese Unexamined Patent (Tokkaihei) No. 4-219394. However, it is insufficient yet with respect to homogeneity in composition and uniformity in thickness of an epitaxial film, particularly for wafer substrates with a large diameter.

SUMMARY OF THE INVENTION

It is a primary object of the present invention to provide a reliable method and apparatus for vapor phase deposition in producing a semiconductor film such as $Hg_{1-x}Cd_xTe$ with good homogeneity in composition and uniformity in thickness of the film throughout the wafer surface and from wafer to wafer.

A first feature of the present invention is to provide a method for producing a semiconductor film comprising steps of:

(a) keeping a reactor chamber having a substrate and source gases in it in isolation from the outside for a certain period of time before starting vapor phase deposition on the substrate surface under conditions that substantially no vapor phase deposition takes place on either the surface of the substrate or the inside wall of the chamber by lack of at least one of factors vital to the vapor phase deposition; and (b) carrying out the vapor phase deposition on the surface of the substrate keeping the chamber in isolation from the outside by fulfilling the above lacking factor so as to satisfying all conditions necessary to the vapor phase deposition.

A second feature of the present invention is to provide a method for producing a semiconductor film according to the first feature, further comprising steps of:

(a) supplying source gases to the vapor phase of the reactor chamber for a first period of time under conditions that substantially no vapor phase deposition takes place on either the surface of the substrate or the inside wall of the chamber by keeping the vapor pressure of the source gas insufficient for the vapor phase deposition;

(b) keeping the chamber in isolation from the outside for a second period of time following the first period under conditions that substantially no vapor phase deposition takes place on either the surface of the substrate or the inside wall of the chamber by keeping the vapor pressure of the source gas insufficient for the vapor phase deposition;

(c) carrying out the vapor phase deposition on the surface of the substrate keeping the chamber still in isolation from the outside for a third period of time following the second period by providing the vapor pressure of the source gas sufficient for the vapor phase deposition; and (d) exhausting the chamber of the residual gas for a forth period of time following the third period.

A third feature of the present invention is to provide a method for producing a semiconductor film according to the first feature, further comprising steps of:

(a) supplying source gases to the vapor phase of the reactor chamber for a first period of time under conditions that substantially no vapor phase deposition takes place on either the surface of the substrate or the inside wall of the chamber by keeping the temperature of either the surface of the substrate or the inside wall of the chamber inadequate to the vapor phase deposition;

(b) keeping the chamber in isolation from the outside for a second period of time following the first period under conditions that substantially no vapor phase deposition takes place on either the surface of the substrate or the inside wall of the chamber by keeping the temperature of either the surface of the substrate or the inside wall of the chamber still inadequate to the vapor phase deposition;

(c) carrying out the vapor phase deposition on the surface of the substrate keeping the chamber still in isolation from the outside for a third period of time following the second period by providing the temperature of the surface of the substrate adequate to the vapor phase deposition; and (d) exhausting the chamber of the residual gas for a forth period of time following the third period.

A fourth feature of the present invention is to provide an apparatus of vapor phase deposition for producing a semiconductor film on a surface of a substrate comprising a means of changing the vapor pressure of the source gases in the closed chamber.

In conventional deposition systems, condensation of source materials on the substrate surface takes place simultaneously by feeding them to the vapor phase and exhausting the reactor chamber of the residual gas, which produces steady state local non-homogeneity in density of the source molecules of both the vapor phase and solid phase. While in the present invention, better homogeneity can be realized by setting an intermediating time between the supplying step and condensation step so that the source materials of all phases in a closed reactor chamber are maintained substantially in thermal equilibrium.

These and other features and advantages of the method and apparatus for semiconductor films made thereby in accordance with this invention will become more apparent from the following detailed description and drawings thereof.

BRIEF DESCRIPTION OF THE DRAWINGS

FIG. 1 is a cross-sectional view of an apparatus for growing semiconductor films related to the first embodiment of the present invention.

FIG. 2 is a diagram showing an operational sequence for growing a semiconductor film related to the first embodiment of the present invention.

DESCRIPTION OF THE PREFERRED EMBODIMENTS

Figure 4:
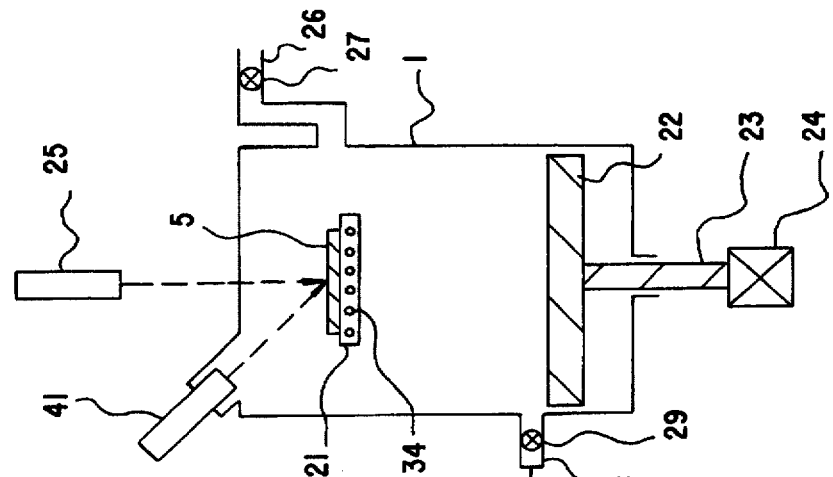
FIG. 4 is a cross-sectional view of an apparatus for growing semiconductor films related to the second embodiment of the present invention.

Referring to FIG. 1, an apparatus for growing semiconductor films according to the present invention, for example, includes a reactor chamber 1 made of a cylindrical fused-silica glass which is 100 mm in diameter and 200 mm high. A wafer stage 21 made of carbon with a heating unit 34, having a 3-inch diameter CdTe wafer 5 on it, is attached air-tightly to a hole of the top wall, and separable for exchanging the wafer. The chamber 1 has a circular moving plate (piston) 22 made of fused-silica glass in it which is air-tight against the inside wall of the cylindrical chamber 1, and connected to driving mechanism 24 by a piston rod 23. The piston 22 can perform reciprocating motion in the vertical direction by means of cam mechanism (not shown) so that the volume of the chamber can be changed to control the pressure of the gases. An inlet tube 28 with its valve 29, and an outlet tube 26 with its valve 27 are also connected to the chamber respectively, and the former supplies source gases from each evaporator, namely reference numeral 31(mercury), 32(di-methylcadmium), or 33(di-isopropyltellurium).

Figure 3B:
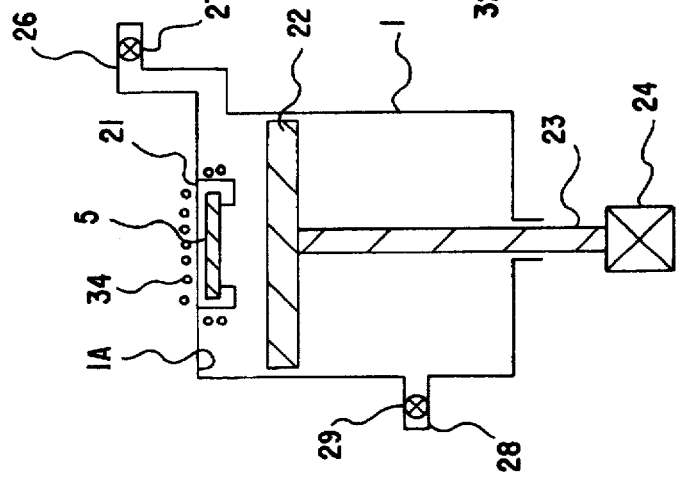
FIGS. 3(a) and 3(b) are cross-sectional views of an apparatus for growing a semiconductor film in different states of the operation related to the first embodiment of the present invention.
Figure 3A:
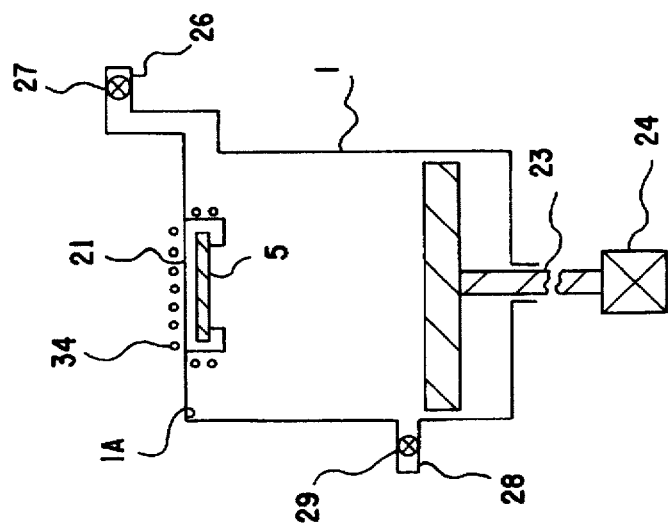

For operating the CVD apparatus of the above described construction, first, the piston 22 is pulled down to the bottom of the chamber 1, and the pressure of the chamber is reduced below about $10^{-2}$ atm (1 atm=101325 Pa) by keeping the outlet valve 27 open and the inlet valve 29 closed. Next, after closing the outlet valve 27, the inlet valve 29 opens so that the total pressure of the chamber reaches 0.1 atm by controlling the partial pressure of each evaporator, namely $10^{-4}$ atm, $10^{-7}$ atm, and $10^{-5}$ atm for mercury, di-methylcadmium, and di-isopropyltellurium, respectively with hydrogen carrier gas. Each vapor pressure for the above total pressure is so low that no crystal of $Hg_{1-x}Cd_xTe$ can grow on the surface of CdTe substrate. As shown in FIGS. 3A and 3B, after closing both the outlet valve 27 and inlet valve 29, the piston 22 is pushed upward to pressurize the chamber, for instance, ten times. It increases each partial pressure up to $10^{-3}$ atm, $10^{-6}$ atm, $10^{-4}$ atm for mercury, di-methylcadmium, and di-isopropyltellurium, respectively, which is sufficient for the crystal growth of $Hg_{1-x}Cd_xTe$.

Since the substrate is already heated at 350° C., all necessary conditions to start the crystal growth, namely, temperature, pressure, and density of the source molecules are provided for the whole surface of the substrate 5. Thus, this allows homogeneous epitaxial growth of $Hg_{1-x}Cd_xTe$ in thickness and composition. Taking a closer look at this process, the piston is pushed so quickly that the compression of the gas is essentially performed under an adiabatic condition at least in the early stage of the compression which eventually raises the temperature of the gas. This is also preferable to the growth rate of the film. However, the epitaxial growth would cease in a few seconds under these circumstances because the source gas is consumed in thermal decomposition for depositing a $Hg_{1-x}Cd_xTe$ film on the substrate 5. Therefore, it is needed that after a certain period of time for epitaxial growth, the outlet valve 27 is opened thereby exhausting the residual gas, and that the piston is again pulled down to the bottom, so that the whole system returns to the initial stage for repetition. Thus, a typical result indicates that a $Hg_{1-x}Cd_xTe$ (where x=0.2) film on a 3-inch CdTe wafer has only 1% (or $\Delta x=0.002$) inhomogeneity in composition, while the conventional method usually results in 5% (or $\Delta x=0.01$). These operational sequences are shown in FIG. 2 in which diagrams 10 and 20 indicate the supply of source gases and the growth of an epitaxial film, respectively. For the time period 1 in FIG. 2 the source gas is fed to the chamber, for the following period 2 the chamber is isolated from the outside by closing both the inlet valve 29 and outlet valve 27, for the next period 3 in diagram 20 the crystal growth takes place by pressurizing the chamber, and for the final period 4 the outlet valve 27 is opened to exhaust the residual gas so that the whole system returns to the initial stage for repetition of the sequence.

FIG. 4 illustrates an another preferred embodiment for producing a semiconductor film according to the present invention.

An apparatus for this example is substantially the same as that for the first embodiment except that the apparatus has at least one irradiating means of energy beams, such as photons 25, electrons 41, or phonons (not shown). The method of growing a semiconductor film of $Hg_{1-x}Cd_xTe$ on CdTe substrate is described in detail herebelow with reference to a particular example of actual operations by using a laser beam. First, the reactor chamber 1 having a piston 22 pulled down to the bottom is filled with the source gas of each partial pressure such as $10^{-3}$ atm, $10^{-6}$ atm, $10^{-4}$ atm for mercury, di-methylcadmium, and di-isopropyltellurium, respectively, which would be sufficient for the crystal growth of $Hg_{1-x}Cd_xTe$. However, the substrate temperature is kept as low as 300° C. so that substantially no epitaxy takes place on the substrate. After maintaining the chamber in isolation from the outside for a few seconds by closing both inlet valve 29 and outlet valve 27 to obtain homogeneity in pressure and density of the source gas throughout the chamber, the surface of the substrate is irradiated several times by a light beam from cw (continuous wave) argon ion laser 25, for example, having an output power density of $10^2 \sim 10^3$ mW/cm$^2$, a spotsize of 100 μm in diameter, and a scan speed of 10 cm/sec. with an overlapped factor of 50%. This gives homogeneous epitaxial growth of $Hg_{1-x}Cd_xTe$. Although what happens here is not clear yet, possible explanations are as follows; The laser beam heats the surface of the substrate locally and instantaneously so that thermal decomposition of the source gas molecules on the surface takes place. Another elementary process is a photon-assisted decomposition of the source gas molecules in the vicinity of the surface. Alternate irradiation energy is an electron beam from an electron gun 41 installed in the chamber with an operation condition, for example, having an acceleration energy of 100 kev, a spotsize of 100 μm in diameter, and deflection frequencies of X- and Y-direction of 100 Hz and 1 KHz, respectively. Further alternate energy is an ultrasonic wave propagated by a piezoelectric converter, for example, having an oscillating frequency of 1~10 GHz and energy density of $10^{-2}$~10 w/cm$^2$ in an operation of a few second. These gave essentially the same results except for efficiency. In the above described embodiments, the vapor pressure and the density of the source gas are kept homogeneous throughout the reactor chamber during the pregrowth and growth period of epitaxy, whereby a more homogeneous epitaxy is achieved than has ever been attained.

The present invention is not limited to MOCVD but is applicable to MBE or a hot wall type epitaxial reactor. An embodiment of the present invention particularly related to MBE or a hot wall typed epitaxial reactor is described below. The reactor chamber is almost the same as that of aforementioned MOCVD case except that the source gas evaporators are replaced by temperature controlled crucibles for each source metal, namely, mercury, cadmium, and tellurium, and that the wafer is placed against the energy beams. Similarly to the MOCVD case, the growth operation is employed by repeating a set of four steps as shown in FIG. 2. In MBE or the hot wall typed epitaxial reactor, for the pregrowth period of epitaxy, the surface of the substrate and the inside of the wall are heated at such a high temperature, for example, higher than 500° C. or preferably 550° C., such that source metal atoms or gas molecules cannot condense on them.

For the first period of time, after the chamber with a pulled-down piston is exhausted to an extremely low pressure such as $10^{-9}$~$10^{-10}$ torr (1 torr=133.322 Pa) by keeping the outlet valve open and the inlet valve closed, the chamber is filled with the metal gas atoms by controlling the temperature of each crucible so that the vapor pressure of each source metal reaches $10^{-1}$ torr, $10^{-6}$ torr, $10^{-6}$ torr for mercury, cadmium, and tellurium, respectively, which would be sufficient for the crystal growth of Hg$_{1-x}$Cd$_x$Te. For the second period of time, the chamber is maintained in isolation from the outside so that substantially thermal equilibrium is valid throughout the inside of the chamber. Then, for the third period of time, that is, the growth period of epitaxy, the surface of the substrate is locally cooled down to such a low temperature, for example, lower than 400° C. or preferably 300° C., that the source metal atoms or gas molecules in vapor phase can start condensing selectively on the surface of the substrate. Cooling the wafer is done by circulating a liquid coolant in the wafer stage. Needless to say, pressurizing the chamber by pushing up the piston is also helpful to increase the growth rate in this embodiment. Since the growth rate of epitaxy decreases sharply within a few seconds due to a limited quantity of the source atoms in the vapor phase of the closed chamber, it is necessary to return to the initial stage by evacuating the residual gas of the chamber for repetition. This embodiment also results in significant improvement on local non-homogeneity in epitaxial growth. It should be noticed that according to the present invention, the means to change the volume to control the pressure of source gases for the vapor phase deposition is not limited to merely the piston, but for instance, bellows made of flexible steel, or any other mechanism which can pressurize the chamber is also available for this purpose.

What is claimed is:

1. A method for vapor phase deposition in a reactor chamber comprising the following steps (a) through (d) in the order recited:
   (a) supplying a source gas in a vapor phase to the reactor chamber having a substrate therein;
   (b) maintaining the source gas in the vapor phase for a period of time, during which a gas-inlet and a gas-outlet for the source gas are closed and the reactor chamber is maintained at a constant volume, so that vapor pressure and density of the source gas are kept homogeneous throughout the reactor chamber;
   (c) compressing a volume of the reactor chamber to make a partial pressure of the source gas so high that the vapor phase deposition on the substrate occurs, and
   (d) maintaining the compressed volume of the reactor chamber constant until the source gas is completely consumed by vapor phase deposition.

2. The method for vapor phase deposition according to claim 1, wherein compressing the volume is carried out by employing a cylindrical chamber and a piston which together define the reactor chamber, the piston capable of a reciprocating motion with air-tight fitting to an inside wall of the cylindrical chamber, and the volume of the reactor chamber can be changed to control a pressure of a gas contained therein.

3. The method for vapor phase deposition according to claim 1, wherein the vapor phase deposition is carried out by substantially an adiabatic compression of the source gas in the reactor chamber.

4. The method for vapor phase deposition according to claim 1, further comprising the step (e) of exhausting the reactor chamber and expanding the volume in an final stage of the step (d) up to a volume in an initial stage of the step (a).

5. The method for vapor phase deposition according to claim 1, wherein the volume is compressed to one-tenth of an initial volume of step (a).

6. The method for vapor phase deposition according to claim 1, wherein the substrate is a single crystalline wafer and the vapor phase deposition is an epitaxial growth.

7. A method for vapor phase deposition in a reactor chamber having a substrate therein comprising the following steps (a) through (e) in the order recited:
   (a) supplying a source gas in a vapor phase to the reactor chamber while the substrate is maintained at a temperature lower than a temperature at which vapor phase deposition occurs;
   (b) closing a gas-inlet and a gas-outlet for the source gas maintained in the vapor phase in the reactor chamber;
   (c) compressing a volume of the reactor chamber to pressurize the source gas in the vapor phase;
   (d) maintaining the source gas in the vapor phase for a period of time, while the reactor chamber is maintained at a constant volume, so that vapor pressure and density of the source gas are kept homogeneous throughout the reactor chamber; and
   (e) heating the substrate so that the vapor phase deposition on the substrate occurs.

8. The method for vapor phase deposition according to claim 7, wherein the substrate is a single crystalline wafer and the vapor phase deposition is an epitaxial growth.

* * * * *